United States Patent
Schat (10) Patent No.: US 10,591,536 B1
(45) Date of Patent: Mar. 17, 2020

(54) APPARATUSES AND METHODS INVOLVING ERROR DETECTION AND CORRECTION OF LINEAR ANALOG CIRCUITS

(71) Applicant: NXP B.V., Eindhoven (NL)

(72) Inventor: Jan-Peter Schat, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/201,396

(22) Filed: Nov. 27, 2018

(51) Int. Cl.
  *G01R 31/28* (2006.01)
  *G01R 31/3161* (2006.01)
  *G01R 31/316* (2006.01)
  *H03M 1/10* (2006.01)

(52) U.S. Cl.
  CPC ....... *G01R 31/3161* (2013.01); *G01R 31/316* (2013.01); *H03M 1/1071* (2013.01)

(58) Field of Classification Search
  CPC .............. G01R 31/3161; G01R 31/316; G01R 31/3163; G01R 31/3167; G06F 17/5036; H03M 1/109; H03M 1/1071; H03M 1/1076; H03M 1/108
  See application file for complete search history.

(56) References Cited

U.S. PATENT DOCUMENTS

| | | | |
|---|---|---|---|
| 6,418,550 B1 | 7/2002 | Heinrich | |
| 6,748,342 B1 | 6/2004 | Dickhaus | |
| 8,299,802 B2 * | 10/2012 | Wong | G01R 31/3167 324/537 |
| 8,612,840 B2 | 12/2013 | Kehl | |
| 2011/0227769 A1 * | 9/2011 | Lin | H03M 1/109 341/120 |
| 2012/0206282 A1 * | 8/2012 | Gorbold | G01R 31/3167 341/120 |

OTHER PUBLICATIONS

Checksum-based concurrent Error Detection in linear analog Systems with second and higher order Stages, Abhijit Chatterjee, 1992 IEEE VLSI Test Symposium, pp. 286-291.

A New Approach to Fault-Tolerance in linear analog Systems based on checksum-coded State-Space Representations, Abhijit Chatterjee IEEE International Conference on Computer Design: VLSI in Computers & Processors, pp. 478-481 (1992).

(Continued)

*Primary Examiner* — Christine T. Tu (57) ABSTRACT

An apparatus includes a linear analog circuit and data-check circuit. The linear analog circuit receives analog input signals and provides processed analog output signals. The linear analog circuit includes voltage-changing and voltage-impedance circuitry that perform processing of the analog input signals by the linear analog circuit and an analog test bus circuit (ATB) that selectively passes different ones of a plurality of input ports to at least one output port. A data-check circuit is communicatively coupled to the ATB and includes a data-processing circuit that detects an error conveyed by the linear analog circuit by applying a control signal, while the linear analog circuit and the data-check circuit facilitate testing of the linear analog circuit, to cause the ATB to selectively pass the different ones of the plurality of input ports.

20 Claims, 8 Drawing Sheets

(56) References Cited

OTHER PUBLICATIONS

The Design of Fault-Tolerant Linear Digital State Variable Systems: Theory and Techniques Abhijit Chatterjee, Manuel A. d'Abreu, IEEE Transactions on Computers, vol. 42, No. 7, Jul. 1993, pp. 794-808.

Hardware Reduction in concurrent Error Detection Checkers in linear analog Circuits using continuous Checksums, Mike W. T. Wong Yingquan Zhou and Yinghua Min, 1995 TENCON '95., IEEE Region 10 International Conference on Microelectronics and VLSI, pp. 359-362.

Concurrent Error Detection in Linear Analog Circuits Using State Estimation, Haralampos-G. D. Stratigopoulos, Yiorgos Makris, ITC International Test Conference 2003, pp. 1164-1173.

Design of Concurrent Test Hardware for Linear Analog Circuits with Constrained Hardware Overhead, Sule Ozev, Alex Orailoglu, IEEE Transactions on very large scale Integration (VLSI) Systems, vol. 12, No. 7, Jul. 2004, pp. 756-765.

Concurrent Detection of Erroneous Responses in Linear Analog Circuits, Haralampos-G. D. Stratigopoulos, IEEE Transactions on Computer-Aided Design of integrated Circuits and Systems, vol. 25, No. 5, May 2006, pp. 878-891.

Design of Low Cost Fault Tolerant Analog Circuits Using Real-Time Learned Error Compensation, Suvadeep Banerjee, Álvaro Gómez-Pau, Abhijit Chatterjee, 2014 19th IEEE European Test Symposium (ETS), pp. 1-2.

Real-Time Transient Error and Induced Noise Cancellation in Linear Analog Filters Using Learning-Assisted Adaptive Analog Checksums, Álvaro Gómez-Pau, Suvadeep Banerjee, Abhijit Chatterjee, 2014 IEEE 20th International On-Line Testing Symposium (IOLTS), pp. 25-30.

Real-Time DC Motor Error Detection and Control Compensation Using Linear Checksums, Md Imran Momtaz, Suvadeep Banerjee, Abhijit Chatterjee, 2016 IEEE 34th VLSI Test Symposium (VTS), pp. 1-6.

Probabilistic Error Detection and Correction in Switched Capacitor Circuits Using Checksum Codes, Md Imran Momtaz, Suvadeep Banerjee, Abhijit Chatterjee, 2017 IEEE 23rd International Symposium on On-Line Testing and Robust System Design (IOLTS), pp. 271-276.

Design of Efficient Error Resilience in Signal Processing and Control Systems: From Algorithms to Circuits, Jacob Abraham, Suvadeep Banerjee, Abhijit Chatterjee, 2017 IEEE 23rd International Symposium on On-Line Testing and Robust System Design (IOLTS), pp. 192-195.

On-Line Diagnosis and Compensation for Parametric Failures in Linear State Variable Circuits and Systems Using Time-Domain Checksum Observers, Md Imran Momtaz, Suvadeep Banerjee, Abhijit Chatterjee, 2017 IEEE 35th VLSI Test Symposium (VTS), pp. 1-6.

Real-Time Self-Learning Error Control Law Adaptation in Nonlinear Systems Using Encoded Check States, Suvadeep Banerjee and Abhijit Chatterjee, 2017 22nd IEEE European Test Symposium (ETS), pp. 1-6.

\* cited by examiner

APPARATUSES AND METHODS INVOLVING ERROR DETECTION AND CORRECTION OF LINEAR ANALOG CIRCUITS

OVERVIEW

Aspects of various embodiments are directed to apparatuses and methods for detecting and correcting errors of a linear analog circuit.

A variety of tests can be used to detect and correct faults in analog and/or mixed-signal circuits. Such tests can require the addition of hardware and can impact the operation and layout needs of the circuitry.

These and other matters have presented challenges to efficiencies of error detection and correction in linear analog circuit implementations, for a variety of applications.

SUMMARY

Various example embodiments are directed to issues such as those addressed above and/or others which may become apparent from the following disclosure concerning detecting and correcting errors of a linear analog circuit.

In certain example embodiments, aspects of the present disclosure involve an analog test bus circuit (ATB) located on a linear analog circuit used to detect and correct an error conveyed by the linear analog circuit by using a control signal to cause the ATB to selectively pass different outputs of (internal) nodes of the linear analog circuit to data-check circuit. The data-check circuit facilitates testing of the linear analog circuit including facilitating an analog checksum test, a built-in self-test (BIST) and/or a built-in fault injection test (BIFI), and without adding additional circuitry to the linear analog circuit.

In a more specific example embodiment, an apparatus includes a linear analog circuit and data-check circuit, which may form part of a discrete circuit or an integrated circuit (IC). The linear analog circuit receives analog input signals and provides processed analog output signals. The linear analog circuit includes voltage-changing circuitry, voltage-impedance circuitry, and an ATB. The voltage-changing circuitry and voltage-impedance circuitry collectively perform processing of the analog input signals by the linear analog circuit. As may be appreciated and as further described herein, the voltage-changing circuitry includes linear circuit elements that do not carry states and hence do not store energy (e.g., resistors and amplifiers), and the (linear) voltage-impedance circuitry are state carrying circuit elements that store energy, such as capacitors, inductors, and/or other circuits that store energy. For example, the (linear) voltage-changing circuitry modulates the analog input signals as provided at a plurality of voltage nodes and provides modulated analog signals at an output of the voltage-changing circuitry. The (linear) voltage-impedance circuitry, including capacitive circuitry, impedes the modulated analog signals and provides impeded analog signals modulated at an output of the voltage-impedance circuitry. The ATB includes a plurality of input ports that selectively pass different ones of the plurality of input ports to at least one output port with the input ports being connect to the voltage-changing circuitry and voltage-impedance circuitry. As further described herein, the ATB can selectively output processed analog output signals associated with one (internal) node of voltage-changing circuitry and voltage-impedance circuitry at a time.

The data-check circuit can facilitate at least two of the following tests: an analog checksum test, a BIST, and a BIFI.

In some embodiments, the data-check circuit facilitates each of an analog checksum test, a BIST, and a BIFI. For example, the linear analog circuit and the data-check circuit collectively facilitate carry out testing of the linear analog circuit by testing for parametric and transient faults via each of the analog checksum test, BIST, and BIFI. In other embodiments, the linear analog circuit and the data-check circuit collectively facilitate testing of the linear analog circuit by using an analog-to-digital converter (ADC) and the data-processing circuit to process signals via an algorithm that facilitates only one of the BIST and the analog checksum test or at least one of a BIST and a BIFI in response to an analog checksum test detecting the error.

In a number of embodiments, the data-check circuit further includes an ADC and/or a digital-to-analog converter (DAC). The ADC can be used to facilitate the BIST and the DAC can be used to facilitate the BIFI. Further, the apparatus can include BIST circuitry that carries out the BIST and/or BIFI circuitry that carries out the BIFI, with the data-check circuit carrying out the analog checksum test (which can optionally be concurrent with an application mode) and facilitating the BIST and BIFI.

In various embodiments, the linear analog circuit can receive the analog input signals (e.g., voltage signals) and provides the processed analog output signals while the linear analog circuit and the data-check circuit carry out testing of the linear analog circuit, such as carrying out an analog checksum test. The linear analog circuit can provide the processed analog output signals during an application mode of the apparatus and simultaneously with the linear analog circuit and the data-check circuit carrying out testing of the linear analog circuit.

The linear analog circuit and the data-check circuit can collectively carry out the testing of the linear analog circuit for low-frequency signals received by the ATB, relative to a sampling-frequency capacity of the ADC, by using the data-processing circuit to process sequentially-received signals via a quasi-parallel processing algorithm and to estimate and offset time delays associated with different internal nodes of the linear analog circuit, and therein emulating testing of probing of the different internal nodes concurrently or simultaneously. In other embodiments and/or in addition, the linear analog circuit and the data-check circuit collectively carry out the testing of the linear analog circuit for signals received by the analog test bus circuit and which have a period length of an order corresponding to a sampling-frequency capacity of the ADC, by causing the ADC and the data-processing circuit to undersample and therein estimate a voltage difference between the signals at the plurality of internal nodes. Further, the model of the linear analog circuit used in the analog processing algorithm of the data-check circuit can include selective time delays, for offsetting signal skew, in signals driving the ATB. For example, the linear analog circuit and the data-check circuit can collectively carry out the testing of the linear analog circuit by using the ADC and the data-processing circuit to process signals via an algorithm configured to model time delays in respective signals directed towards the ATB, for offsetting signal skew.

The ATB can access the linear analog circuit by passing analog values (e.g., voltages or currents) to and from the linear analog circuit. In various embodiments, the data-check circuit further includes a DAC communicatively located between the data-processing circuit and ATB. The DAC can send a correction signal to the linear analog circuit in response to the detected error conveyed by the linear analog circuit.

In a number of more specific embodiments, the apparatus includes multiple linear analog circuits. For example, the apparatus further includes at least one additional linear analog circuit that provides processed analog output signals. The at least one additional linear analog circuit includes another voltage-changing circuitry and another voltage-impedance circuitry that collectively perform processing of the analog input signals by the additional linear analog circuit, and another ATB including a plurality of input ports that selectively passes different ones of the plurality of input ports to at least one output port. The apparatus further includes a central ATB that receives signals provided from each of the linear analog circuits, including the first-recited linear analog circuit and the at least one additional linear analog circuit, and sends signals toward the data-check circuit. The data-check circuit can perform testing of the each of the linear analog circuit and the at least one additional linear analog circuit by running, for each respectively, an analog checksum test.

Another specific example embodiment is directed to a method of using the above-described apparatus. The method can include receiving, at a linear analog circuit, analog input signals and providing processed analog output signals, the linear analog circuit includes voltage-changing circuitry and voltage-impedance circuitry that collectively perform processing of the analog input signals by the linear analog circuit, and an ATB including a plurality of input ports. The method further includes modulating the analog input signals as provided at a plurality of voltage nodes of the voltage-changing circuitry and providing modulated analog signals at an output of the voltage-changing circuitry, impeding the modulated analog signals, via the voltage-impedance circuitry, including capacitive circuitry, and providing impeded analog signals modulated at an output of the voltage-impedance circuitry. Additionally, the method includes driving an input of voltage-impedance circuitry and one of the plurality of input ports of the ATB via the output of the voltage-changing circuitry, and another of the plurality of input ports of the ATB via the output of the voltage-impedance circuitry, and selectively passing different ones of the plurality of input ports to at least one output port of the ATB responsive to a control signal. And, in case an error conveyed by the linear analog circuit is detected, via a data-check circuit including an ADC communicatively coupled to the at least one output port of the analog test bus circuit and including a data-processing circuit, by applying the control signal, while the linear analog circuit and the data-check circuit carry out testing of the linear analog circuit, to cause the ATB to selectively pass the different ones of the plurality of input ports (and/or to pass the error correction signal to the respective state-carrying element, like a capacitor or an inductor).

In various specific embodiments, the method includes providing the processed analog output signals during an application mode of the apparatus and simultaneously with the linear analog circuit and the data-check circuit carrying out testing of the linear analog circuit. Detecting the error conveyed by the linear analog circuit can include comparing datum indicative of the modulated analog signals and the impeded analog signals to one or more expected values. And, in specific embodiments, the method further includes sending a correction signal to the linear analog circuit in response to the detected error conveyed by the linear analog circuit via a DAC communicatively located between the data-processing circuit and the ATB.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving detecting and, optionally, correcting faults in linear analog circuits. In certain implementations, aspects of the present disclosure have been shown to be beneficial when used in the context of use of an analog test bus circuit (ATB) located on a linear analog circuit to detect an error conveyed by the linear analog circuit by using a control signal to cause the ATB to selectively pass different voltages or currents of internal nodes of the linear analog circuit. In some embodiments, a data-check circuit can be in communication with the linear analog circuit having the ATB to facilitate testing of the linear analog circuit, including two or more of built-in self-test, an analog checksum test, and a built-in fault injection test, and without adding additional circuitry to the linear analog circuit. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

A number of different tests can be used to detect faults in analog and/or mixed-signal circuits. Systems using analog checksum tests can detect and correct faults in analog/mixed-signal circuits. As the checksum mechanism runs concurrent to the application mode, it can detect both permanent and transient faults. Another way to detect faults in analog and/or mixed-signal circuits is a built-in self-test (BIST). When running intermittent to the application mode, it can test a circuit under various conditions, e.g., minimum and maximum supply voltages. A BIST can detect some faults that checksum mechanisms may be unable to detect. As opposed to analog checksum tests, transient faults cannot be detected using a BIST, however. An analog checksum test and BIST can complement each other in detecting hard defects and in detecting parametric deviations, that may be caused by aging or by slowly activated latent defects. As a specific example, the analog checksum tests can tell "how much is the analog block deviating from its implemented function?" and the BIST tells "is the analog block still fulfilling the specification?"

To obtain a more-complete fault coverage, a built-in fault injection test (BIFI) can additionally or alternatively be used. In a test mode, a BIFI temporarily injects faults at different internal nodes of the linear analog circuit in order to verify if the analog checksum test and BIST work correctly. The analog checksum test, BIST, and BIFI can complement each other. Embodiments in accordance with the present disclosure are directed to an apparatus including a linear analog circuit in communication with a data-check circuit that carries out an analog checksum test and facilitates combining the three test methods, without any modification of the linear analog circuit itself, and minimal hardware overhead. In specific implementations, the apparatus can obtain and provide a high Diagnostic Coverage (e.g., 99% for ASIL D according to the Institute of Electrical and Electronics Engineers (IEEE) International Organization for Standardization (ISO) 26262 standard) in linear analog circuits, including the hard-to-detect transient and parametric faults.

In accordance with various embodiments, apparatuses using analog checksums tests allow nearly the same level of fault detection and correction as dual or triple redundancy, while only using a small fraction of the area and power overhead of these. To calculate analog checksums, in various embodiments, the linear analog circuit is not modified (e.g., no additional hardware), as long as certain internal nodes of the analog/mixed-signal block can be probed. This is often the case for many applications, such as for safety-related ICs, as linear analog circuits can be equipped with an analog test bus circuit (ATB) for used in production testing. Calculating and comparing the checksums is done by a simple linear analog circuit.

A number of specific embodiments are directed to an apparatus including a linear analog circuit and data-check circuit, which may form part of a discrete circuit or an integrated circuit (IC). The linear analog circuit receives analog input signals and provides processed analog output signals. For example, the linear analog circuit includes voltage-changing circuitry, voltage-impedance circuitry, and an ATB. The voltage-changing circuitry and voltage-impedance circuitry collectively perform processing of the analog input signals by the linear analog circuit. The ATB includes a plurality of input ports that selectively pass different ones of the plurality of input ports to at least one output port with the input ports being connect to the voltage-changing circuitry and voltage-impedance circuitry. The voltage-changing circuitry modulates the analog input signals as provided at a plurality of voltage nodes and provides modulated analog signals at an output of the voltage-changing circuitry. The voltage-impedance circuitry, including capacitive circuitry, impedes the modulated analog signals and provides impeded analog signals modulated at an output of the voltage-impedance circuitry As further described herein, the ATB can selectively output processed analog output signals associated with one internal node (which include the above-noted voltage nodes) of voltage-changing circuitry and voltage-impedance circuitry at a time.

The data-check circuit can facilitate one or more tests including one of, two of, or all of an analog checksum test, a BIST, and a BIFI. In various embodiments, the data-check circuit further includes an analog-to-digital converter (ADC) and/or digital-to-analog converter (DAC). The ADC can be used to facilitate the BIST and the DAC can be used to facilitate the BIFI. For example, the DAC is communicatively located between the data-processing circuit and the ATB, and sends a correction signal to the linear analog circuit in response to the detected error conveyed by the linear analog circuit. In various embodiments, the linear analog circuit receives the analog (e.g., voltages or currents) signals and provides the processed analog output signals while the linear analog circuit and the data-check circuit carry out testing of the linear analog circuit. For example, the linear analog circuit can provide the processed analog output signals during an application mode of the apparatus and simultaneously with the linear analog circuit and the data-check circuit carrying out testing of the linear analog circuit.

In a number of specific embodiments, the linear analog circuit and the data-check circuit collectively carry out the testing of the linear analog circuit for low-frequency signals received by the analog test bus circuit, relative to a sampling-frequency capacity of the ADC, by using the data-processing circuit to process sequentially-received signals via a quasi-parallel processing algorithm and to estimate and offset time delays associated with different internal nodes of the linear analog circuit, and therein emulating testing of probing of the different internal nodes concurrently or simultaneously. Although embodiments are not limited to low-frequency signals. In other embodiments, the linear analog circuit and the data-check collectively carry out the testing of the linear analog circuit for signals received by the ATB and which have a period length of an order corresponding to a sampling-frequency capacity of the ADC, by causing the ADC and the data-processing circuit to undersample and therein estimate a voltage difference between the signals at the plurality of internal nodes. Alternatively and/or in addition, the data-check circuit and the linear analog circuit collectively carry out the testing of the linear analog circuit by using the ADC and the data-processing circuit to process signals via an algorithm that models time delays in respective signals directed towards the ATB, for offsetting signal skew.

In various embodiments, the apparatus can further include BIST circuitry and/or BIFI circuitry that respectively carry out the BIST and BIFI. The BIST can be facilitated via an ADC of the data-check circuit and the BIFI can be facilitated via the DAC of the data-check circuit. The data-check circuit can facilitate all, two or only one of these tests.

In a number of embodiments, the apparatus further includes at least one additional linear analog circuit that provides processed analog output signals. The at least one additional linear analog circuit includes another voltage-changing circuitry and another voltage-impedance circuitry that collectively perform processing of the analog input signals by the additional linear analog circuit, and another ATB including a plurality of input ports that selectively passes different ones of the plurality of input ports to at least one output port. The apparatus further includes a central ATB that receives signals provided from each of the linear analog circuits, including the first-recited linear analog circuit and the at least one additional linear analog circuit, and sends signals toward the data-check circuit. The data-check circuit can perform testing of each of the linear analog circuit and the at least one additional linear analog circuit by running, for each respectively, a sequential analog checksum test.

Various other embodiments are directed to methods of using the above-described apparatuses. A method can include receiving, at a linear analog circuit, analog input signals and providing processed analog output signals. As described above, the linear analog circuit includes voltage-changing circuitry and voltage-impedance circuitry that collectively perform processing of the analog input signals by the linear analog circuit, and an ATB including a plurality of input ports. The method further includes modulating the analog input signals as provided at a plurality of voltage nodes of the voltage-changing circuitry and providing modulated analog signals at an output of the voltage-changing circuitry, impeding the modulated analog signals, via the voltage-impedance circuitry, including capacitive circuitry, and providing impeded analog signals modulated at an output of the voltage-impedance circuitry. Additionally, the method includes driving an input of voltage-impedance circuitry and one of the plurality of input ports of the ATB via the output of the voltage-changing circuitry, and another of the plurality of input ports of the analog test bus circuit via the output of the voltage-impedance circuitry, and selectively passing different ones of the plurality of input ports to at least one output port of the ATB responsive to control signal. And, as soon as an error conveyed by the linear analog circuit is detected, via a data-check circuit including an ADC communicatively coupled to the at least one output port of the ATB and including a data-processing circuit, by applying the control signal, while the linear analog circuit and the data-check circuit carry out testing of the linear analog circuit, to cause the ATB to selectively pass the different ones of the plurality of input ports (and/or to pass the error correction signal to the respective state-carrying element, like a capacitor or an inductor).

In various specific embodiments, the method further includes providing the processed analog output signals during an application mode of the apparatus and simultaneously with the linear analog circuit and the data-check circuit carrying out testing of the linear analog circuit. Detecting the error conveyed by the linear analog circuit can include comparing datum indicative of the modulated analog signals and the impeded analog signals to one or more expected values. And, in specific embodiments, the method further includes sending a correction signal to the linear analog circuit in response to the detected error conveyed by the linear analog circuit via a DAC communicatively located between the data-processing circuit and the analog test bus circuit.

Figure 1:
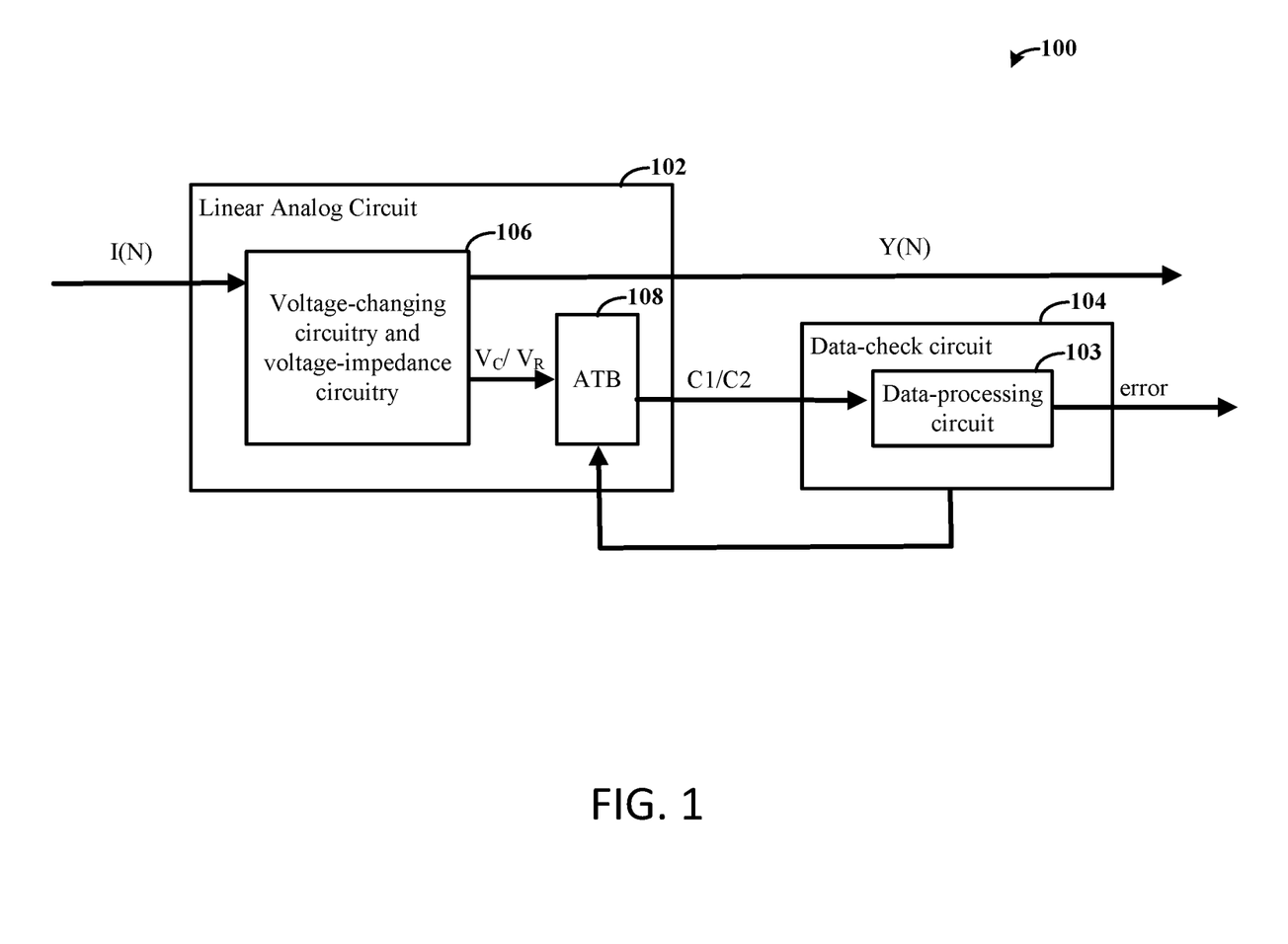
FIG. 1 illustrates an example apparatus for detecting an error conveyed by a linear analog circuit, in accordance with the present disclosure.

Turning now to the figures, FIG. 1 illustrates an example apparatus for detecting an error conveyed by a linear analog circuit, in accordance with the present disclosure. The apparatus 100 facilitates testing of the linear analog circuit 102 (which is herein referred to as "the analog circuit 102" for ease of reference) by carrying out an analog checksum test during an application mode and facilitating combining of the analog checksum test with a BIST and/or a BIFI.

As illustrated, the apparatus 100 includes an analog circuit 102 and data-check circuit 104. As may be appreciated, the analog circuit 102 has voltage-changing circuitry and voltage-impedance circuitry 106 that collectively perform processing of the analog input signals by the analog circuit 102. The voltage-changing circuitry modulates the analog input signals as provided at a plurality of voltage nodes and provides the modulated analog signals at an output of the voltage-changing circuitry. For example, the voltage-changing circuitry includes (linear) circuit elements that do not carry states and hence do not store energy. Example voltage-changing circuitry includes resistors and amplifiers. The voltage-impedance circuitry includes capacitive circuitry that impedes the modulated analog signals and provides impeded analog signals at an output of the voltage-impedance circuitry. The voltage-impedance circuitry are state carrying (linear) circuit elements that store energy, such as capacitors, inductors and other circuits that store energy. The circuitry of the analog circuit 102 can include a variety of linear analog circuitry, with a variety of components.

The apparatus 100 includes the analog circuit 102 having an ATB 108 for tapping out internal voltages $V_C$ and $V_R$ from the voltage-changing and voltage-impedance circuitry 106 (e.g., amplifiers, resistors, and capacitors). The ATB 108 includes a plurality of input ports and are configured and arranged to selectively pass different ones of the plurality of input ports to at least one output port. For example, the output(s) of the voltage-changing circuitry drives an input of voltage-impedance circuitry and one of the plurality of input ports of the ATB 108, and the output(s) of the voltage-impedance circuitry drives another of the plurality of input ports of the analog test bus circuit. The ATB 108 can access the analog circuit by passing analog values (e.g., voltages or currents) to and from the analog circuit 102.

More specifically, the ATB 108 may be used for production testing and may allow for selecting one out of many internal nodes of the voltage-changing and voltage-impedance circuitry 106 at a time. As the calculation of the analog checksum test requires having all voltages $V_R$ and $V_C$ available at the same time, some measures can be taken either to reach this goal, or to achieve the same checksums as if the $V_R$ and $V_C$ are available in parallel, as further described herein at least in connection with FIG. 2.

The data-check circuit 104 provides a test of the analog circuit 102 during an application mode, wherein the diagnostic coverage of the test, for Functional Safety, is high. In specific embodiments, the analog circuit 102 receives the analog input signals (e.g., voltage signals) and provides the processed analog output signals while the analog circuit and the data-check circuit carry out testing of the analog circuit. The data-check circuit 104 is communicatively coupled to the at least one output port of the ATB 108. The data-check circuit 104 includes a data-processing circuit 103 used to detect an error conveyed by the analog circuit 102 by applying a control signal, while the analog circuit 102 and the data-check circuit 104 carry out testing of the analog circuit 102, to cause the ATB 108 to selectively pass the different ones of the plurality of input ports (e.g., pass different voltages or currents of internal nodes of the analog circuit 102).

The data-check circuit 104 can facilitate at least two of the following tests: a BIST, an analog checksum test during an application mode, and a BIFI to provide testing of the analog circuit. In specific embodiments, the data-check circuit facilitates each of an analog checksum test, a BIST, and a BIFI. As further described herein, the data-check circuit 104 can carry out an analog checksum test and can facilitate one or more of a BIST and BIFI.

In specific embodiments, as further illustrated herein, the data-check circuit 104 further includes an ADC and/or a DAC. The ADC can be used to facilitate the BIST and the DAC can be used to facilitate the BIFI. In such embodiments, the apparatus 100 can further include BIST circuitry used to carry out the BIST and BIFI circuitry used to carry out the BIFI, wherein the data-check circuit 104 carries out the analog checksum test (during the application mode) and facilitates the BIST and BIFI. The data-check circuit 104 can be used to evaluate the BIST and/or BIFI circuitry and/or the results provided therefrom. In such embodiments, the analog circuit 102 and the data-check circuit 104 collectively facilitate the testing of the analog circuit by testing for parametric and transient faults via each of the following tests: BIST, BIFI, and an analog checksum test. Although embodiments are not so limited and can include facilitation of one of the tests, two of the tests or all three. In some specific embodiments, and as an example, the data-processing circuit 103 can process signals via an algorithm configured to facilitate at least one of the BIST and the BIFI test and an analog checksum test.

In various embodiments, the analog circuit 102 and the data-check circuit 104 collectively carry out the testing of the analog circuit 102 for low-frequency signals received by the ATB 108, relative to a sampling-frequency capacity of the ADC, by using the data-processing circuit 103 to process sequentially-received signals via a quasi-parallel processing algorithm and to estimate and offset time delays associated with different internal nodes of the analog circuit, and therein emulating testing of probing of the different internal nodes concurrently or simultaneously. Although embodiments are not so limited and the data-check circuit 104 may not include or use an ADC and can carry out an analog checksum test in an analog form, such as for testing high-frequency signals received by the ATB 108. In other embodiments, the analog circuit 102 and the data-check circuit 104 collectively carry out the testing of the analog circuit 102 for signals received by the ATB 108 and which have a period length of an order corresponding to a sampling-frequency capacity of the ADC, by causing the ADC and the data-processing circuit 103 to undersample and therein estimate a voltage difference between the signals at the plurality of internal nodes of the analog circuit 102. In further embodiments, the analog circuit 102 and the data-check circuit 104 collectively carry out the testing of the analog circuit 102 by using the ADC and the data-processing circuit 103 to process signals via an algorithm that is used to model time delays in respective signals directed towards the ATB 108, for offsetting signal skew.

In various embodiments, a DAC is communicatively located between the data-processing circuit 103 of the data-check circuit 104 and the ATB 108. As further described herein, the DAC can be used to send a correction signal to the analog circuit 102 in response to the detected error conveyed by the analog circuit 102.

For clarification, the theory of checksums for detecting faults in the field is described, starting with digital checksums for the sake of better understandability. Checksums for digital linear circuits (e.g. filters) can be implemented as any linear circuit can be implemented as a Moore Machine. Such a Moore Machine consists of combinatorial logic and a state memory, e.g., flip-flops, latches or RAM cells. For more general and specific information related to a checksum test, reference is made to "The Design of Fault-Tolerant Linear Digital State Variable Systems: Theory and Techniques," Abhijit Chatterjee, Manuel A. d'Abreu, IEEE Transactions on Computers, Vol. 42, No. 7, July 1993, pp. 794-808, which is incorporated herein in its entirety for its teaching.

In each clock cycle N, the input data I(N) and state data S(N) are processed in the combinatorial logic, resulting in output data Y(N) and the new states of the next cycle, S(N+1). Each of the values I, S and Y can be a single signal or a vector consisting of several single signals. The state memory is clocked and captures its input S(N+1) with every clock cycle, outputting it as S(N). Additionally, two checksums $c_1(N)$ and $c_2(N)$ are calculated in each clock cycle N. The checksum $c_1(N)$ is calculated from the states S(N) and the inputs I(N). The checksum $c_2(N)$ is calculated from the states S(N) only.

As may be appreciated, the way $c_1$ and $c_2$ are calculated is that $c_1(N)$ is the prediction of $c_2(N+1)$, so that in a fault-free linear block (consisting of combinatorial logic and state memory), $c_1(N)=c_2(N+1)$. Delaying $c_1(N)$ by one cycle results in $c_1(N-1)$ that is equal to $c_2(N)$ in a fault-free linear block. In turn, any non-zero difference $c_1(N-1)-c_2(N)$ indicates a fault in the linear block. The same degree of fault detection can be achieved by dual redundancy, e.g., calculating Y(N) independently with a second instance of the same linear block, fed with the same input signal I(N). This can double the area and power needed, whereas calculating the checksums can use a small fraction of the linear block's area and power. One difference is, that detecting multiple concurrent faults is often possible in dual redundancy, while with checksum-based systems, the number of concurrent faults is restricted by the Hamming distance d, where d−1 faults can be detected and (d−1)/2 faults can be corrected. Such a Hamming distance is also implied in checksum-based systems; depending on the Hamming distance needed, $c_1$ and $c_2$ consist of one or more single signals. The limitation to detecting, e.g., only single and dual faults (as would be given by a Hamming Distance d=3), may not be an issue in various applications, such as Functional Safety, where single faults can be frequent and dual or even triple faults can be rare.

The above-described digital checksum test is similar to an analog checksum test applied to analog circuits. The apparatus is not clocked but time-continuous; the clocked registers are replaced by capacitors which perform integration of currents, resulting in voltages that represent the result of the integration. The states are represented by the capacitors' voltages, while the equivalent of the combinatorial logic is the remaining circuitry except for the capacitors—a circuitry that consists of (or can be modelled as) amplifiers and resistors. Voltages $V_R$ and $V_C$ respectively are tapped out of the analog circuit 102. In the data-check circuit 104, linear analog networks calculate c1 and c2 which are again represented by voltages. Again, c1 and c2 can consist of one or more single signals.

In accordance with various specific embodiments, the detected error can be used to correct for the fault using feedback of the error signal to the capacitor voltage(s) $V_C$. In the general case of n faults in the analog circuit 102, n of these single difference signals are provided back to n of the single $V_c$ signals. The choice of the error signal component(s) and the $V_c$ signal circuitry (e.g., component(s)) to be provided back can depend on the place of the fault in the analog circuit 102. A large number of different adaptive, self-learning strategies can be used to determine which of the single error signals is fed to which of the single $V_c$ components. Such a strategy can be implemented in the compare circuit (as further described herein). The use of a digital compare circuit can allow for ensuring sure that under all circumstances a sufficient phase margin is kept, so that any risk of oscillation is securely eliminated.

Figure 2:
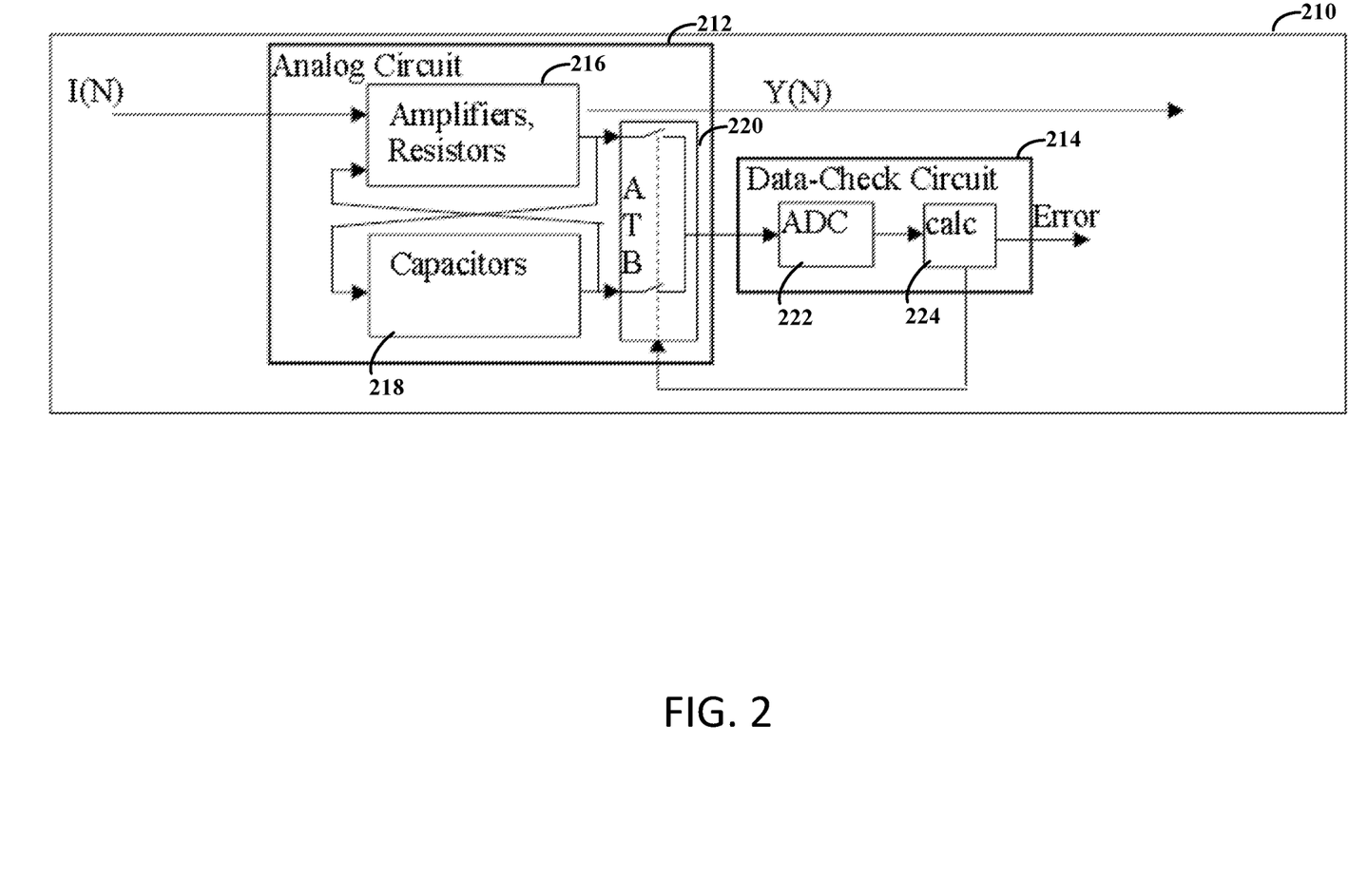
FIG. 2 illustrates another example apparatus for detecting an error conveyed by a linear analog circuit, in accordance with the present disclosure.

FIG. 2 illustrates another example apparatus for detecting an error conveyed by a linear analog circuit, in accordance with the present disclosure. The apparatus 210 can include a discrete circuit or an IC having a linear analog circuit and data-check circuit, such as that previously described above in connection with FIG. 1.

As illustrated, the apparatus 210 includes a linear analog circuit 212 (which is herein referred to as "the analog circuit 212" for ease of reference) having the voltage-changing circuitry (e.g., amplifiers, resistors 216) and voltage-impedance circuitry (e.g., capacitors 218) coupled to the ATB 220. Although the embodiment of FIG. 2 (and various additional figures) shows the voltage-changing circuitry and voltage-impedance circuitry as separate components or boxes, embodiments are not so limited and such components are not necessarily physically separated.

All the analog values (e.g., voltages $V_R$ and $V_C$) are derived via the ATB 220, which can be part of the analog circuit 212, as described above. The data-check circuit 214 captures these analog values sequentially (selection is done by the calculation circuit 224), optionally, digitizes the analog values (e.g., voltages or currents via the ADC 222) and provides the result to a calculation circuit 224 that calculates both checksums and compares them. The calculation circuit 224 can provide a control signal to the ATB 220 to control the selective passing of the different ones of the plurality of input ports.

As previously described, for a more-complete test coverage, such as for parametric and transient faults, the apparatus 210 can be used to facilitate the combination of an analog checksum test and a BIST, with, optionally a BIFI. An analog checksum test and BIST can have a large overlap—with most faults being covered by both. The analog checksum test and BIST can thereby provide a kind of Diverse Dual Redundancy. This synergy allows for carefully relaxing the detection limits of both methods, hence further reducing the risk of a false alert. Likewise, synergy is given by the fact that BIST, BIFI and checksum tests can use ADCs and/or DACs, which can allow for a re-use and saving of area, power and design effort.

Another synergy is found by the implementation that BIST and BIFI are run intermittent to the application mode, while checksums are concurrent. Hence, BIST and BIFI can preferably be activated if and only if checksums fail and/or in addition to one at start-up.

Figure 3:
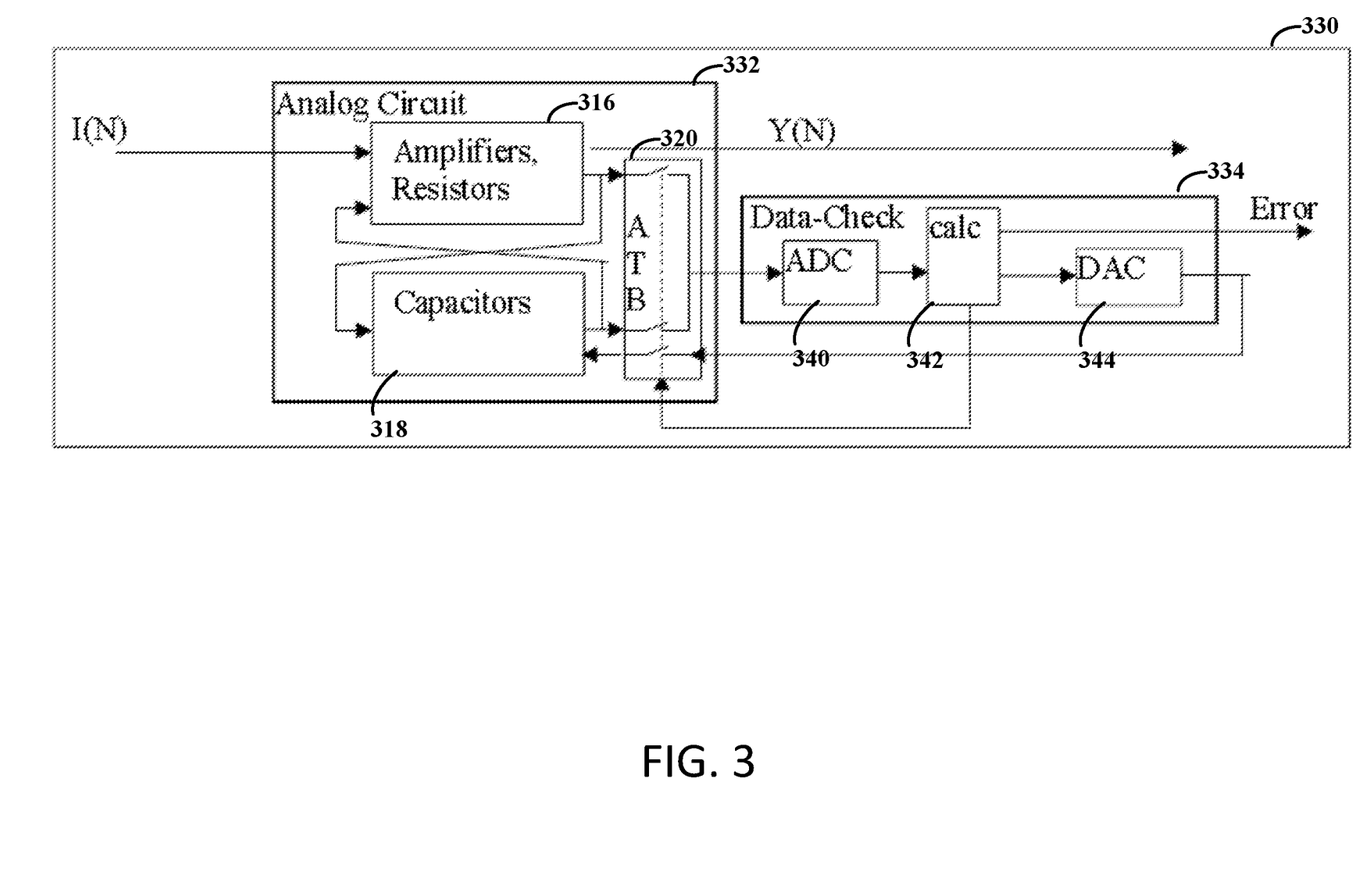
FIG. 3 illustrates an example apparatus for detecting and correcting an error conveyed by a linear analog circuit, in accordance with the present disclosure.

FIG. 3 illustrates an example apparatus for detecting and correcting an error conveyed by a linear analog circuit, in accordance with the present disclosure. Similarly to FIGS. 1 and 2, the apparatus 330 includes a linear analog circuit 332 (which is herein referred to as "the analog circuit 332" for ease of reference) having the voltage-changing circuitry (e.g., amplifiers, resistors 316) and voltage-impedance circuitry (e.g., capacitors 318) coupled to the ATB 320. The data-check circuit 334 captures the output analog values (e.g., voltages) sequentially from the ATB 320 (selection is done by the calculation circuit 342), digitizes the analog values (e.g., via the ADC 340) and provides the result to a calculation circuit 342 that calculates both checksums and compares them. The calculation circuit 342 provides the control signal to the ATB 320 to control the selective passing of the different ones of the plurality of input ports.

The data-check circuit 334 can further include a DAC 344 that detects the error and provides a correction signal back to the analog circuit 332. As the correction signal (e.g., values) are provided to the voltage-impedance circuitry (e.g., capacitors 318), the ATB 320 can be used to implement error corrections. The ATB 320 is laid out with different trees for forcing and sensing. The data-check circuit 334 creates a digital error signal that is converted by a DAC 344. As before, analog checksum tests consisting of more than one signal lead to differences of the same number of signals. As the sampling of the different single signals of $V_R$ and $V_C$ though the ATB 320 cannot be done in parallel, several ways are depicted in different embodiments, as further illustrated and described by FIGS. 4-6 and 7/A-7B.

Figure 4:
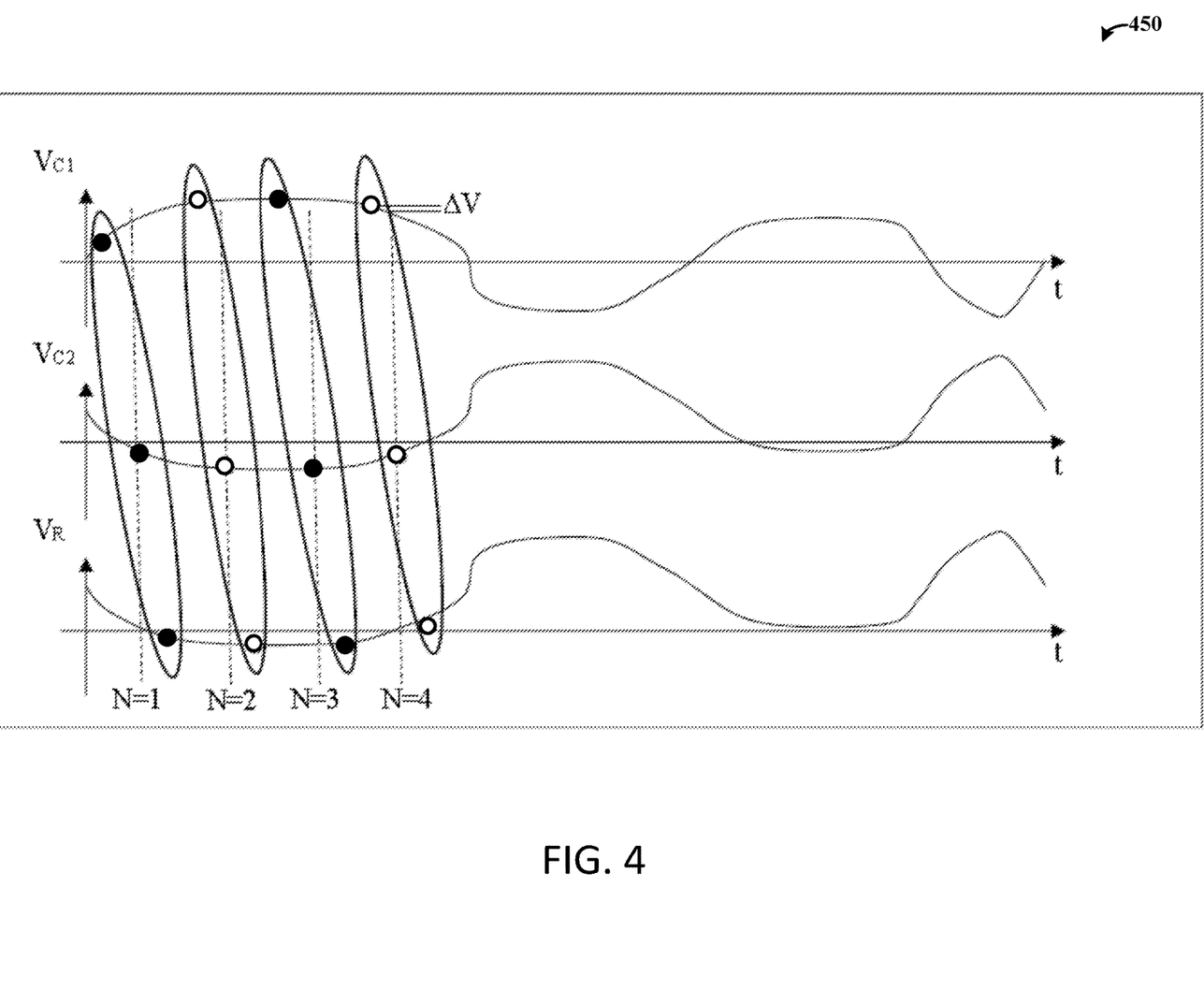
FIG. 4 is a graph illustrating analog signals in an example test facilitated by an apparatus, in accordance with the present disclosure.

FIG. 4 is a graph illustrating analog signals in an example test facilitated by an apparatus, in accordance with the present disclosure. As shown by the graph 450, a quasi-synchronous sampling for slow signals can be used in various embodiments. As previously described, the linear analog circuit and the data-check circuit collectively carry out the testing of the linear analog circuit for low-frequency signals received by the analog test bus circuit, relative to a sampling-frequency capacity of the ADC, by using the data-processing circuit to process sequentially-received signals via a quasi-parallel processing algorithm and to estimate and offset time delays associated with different internal nodes of the linear analog circuit, and therein emulating testing of probing of the different internal nodes concurrently or simultaneously.

In embodiments in which sampling frequency of the ADC in the data-check circuit is much higher than the signal frequency, samples can be taken quasi-parallel so that the resulting error is sufficiently small. FIG. 4 depicts this at an example of $V_C$ that consists of two single signals, and $V_R$ that consists of one single signal. The samples for N=1 to N=4 are marked. Dashed lines mark the time the samples would ideally have been taken, and for one example the ΔV, e.g., the (small) difference between the sampled analog values, such as voltages, at the actual verses the ideal point of time is shown.

Figure 5:
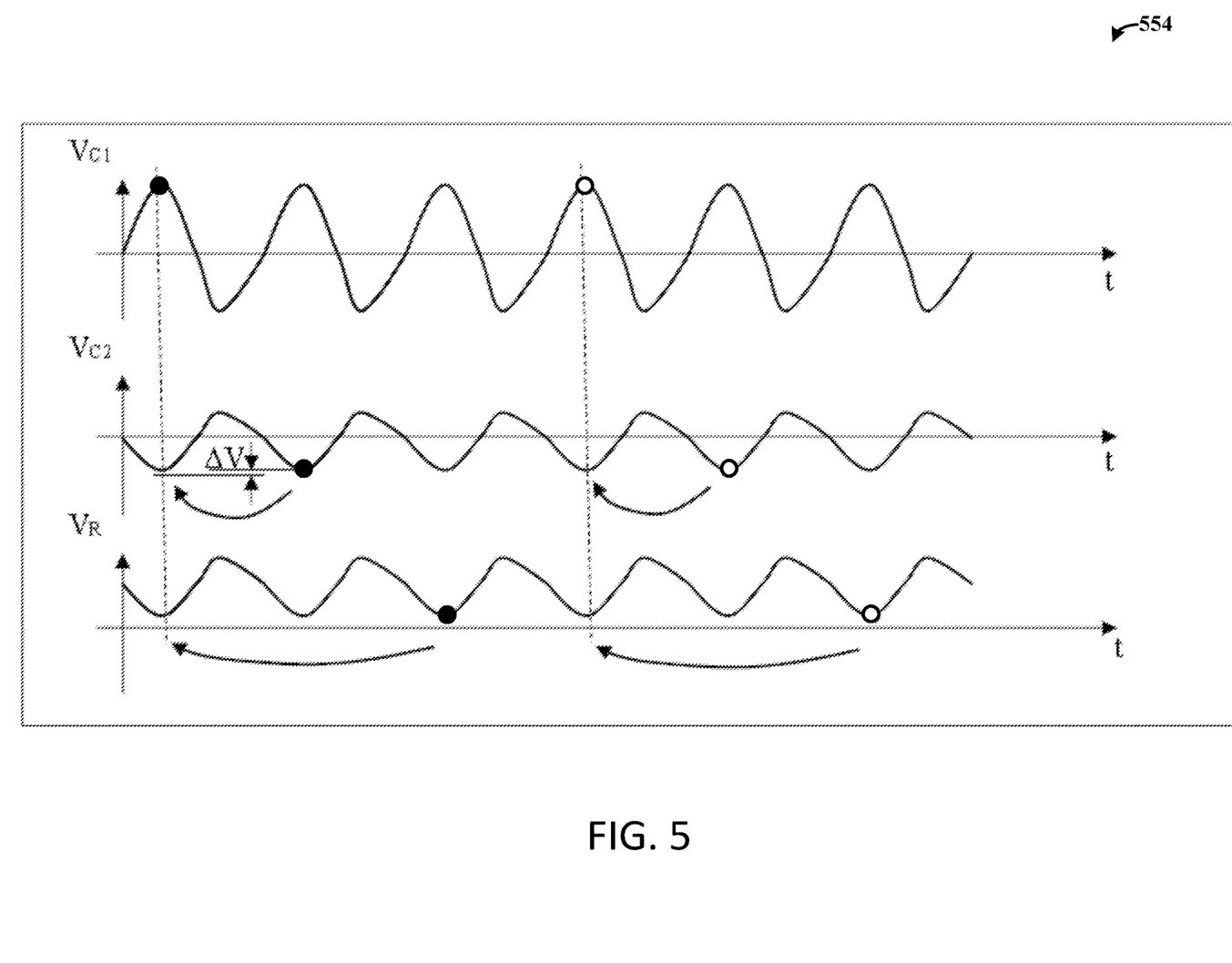
FIG. 5 is a graph illustrating analog signals in an example test facilitated by an apparatus, in accordance with the present disclosure.

FIG. 5 is a graph illustrating analog signals in an example test facilitated by an apparatus, in accordance with the present disclosure. In other embodiments, undersampling can be performed for fast, quasi-stationary signals as shown by the graph 554. The linear analog circuit and the data-check circuit collectively carry out the testing of the linear analog circuit for signals received by the ATB and which have a period length of an order corresponding to a sampling-frequency capacity of the ADC, by causing the ADC and the data-processing circuit to undersample and therein estimate a voltage difference between the signals at the plurality of internal nodes.

In embodiments, in which $V_R$ and $V_C$ signals have a period length in the order of the maximum sampling frequency, but the signals are sufficiently stationary, it is possible to undersample. FIG. 5 depicts this at the same example as in that illustrated by FIG. 4, with $V_C$ that consists of two single signals, and $V_R$ that consists of one single signal. Arrows point to the position the respective sample is actually intended to be. Again, for one example the ΔV, e.g., the (small) difference between the sampled analog values, such as voltages, at the actual versus the point of time is shown.

Figure 6:
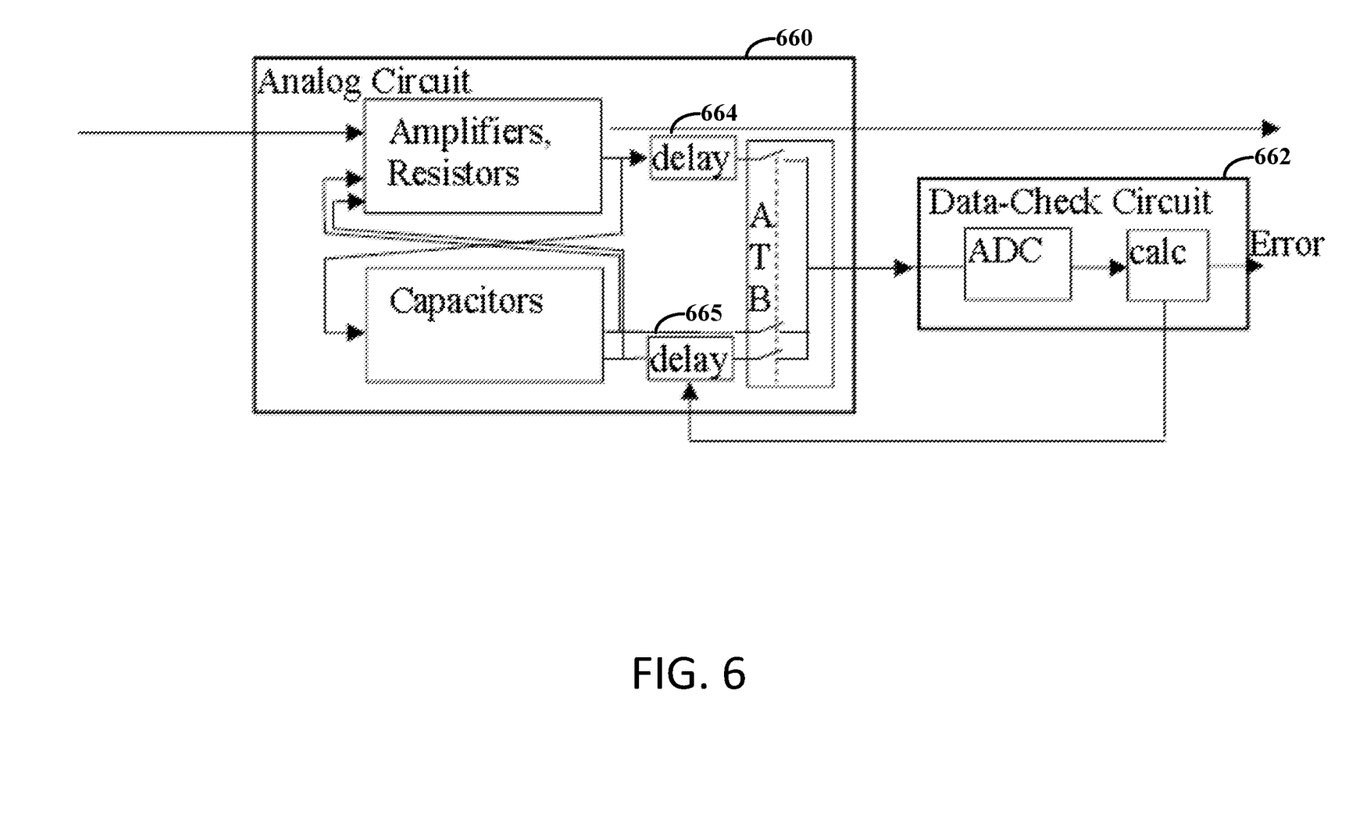
FIG. 6 illustrates a model of an example apparatus, used for calculating the properties of the data-check circuit, for detecting and correcting an error conveyed by a linear analog circuit using modelled delays, in accordance with the present disclosure.

FIG. 6 illustrates a model of an example apparatus, used for calculating the properties of the data-check circuit, for detecting and correcting an error conveyed by a linear analog circuit using modelled delays, in accordance with the present disclosure. In a number of specific embodiments, a model of the linear analog circuit used in an analog processing algorithm of the data-check circuit includes selective time delays, for offsetting signal skew, in signals driving the analog test bus circuit. This model can be used to calculate the properties of the data check circuit 662.

Similarly to FIGS. 1-3, the apparatus includes a linear analog circuit 660 (which is herein referred to as "the analog circuit 660" for ease of reference) having the voltage-changing circuitry (e.g., amplifiers, resistors) and voltage-impedance circuitry (e.g., capacitors) coupled to the ATB. The data-check circuit captures the output analog values (e.g., voltages) sequentially from the ATB (selection is done by the calculation circuit), digitizes the analog values (e.g., via the ADC) and provides the result to a calculation circuit that calculates both checksums and compares them. The calculate circuit provides the control signal to the ATB to control the selective passing of the different ones of the plurality of input ports.

Figure 7A:
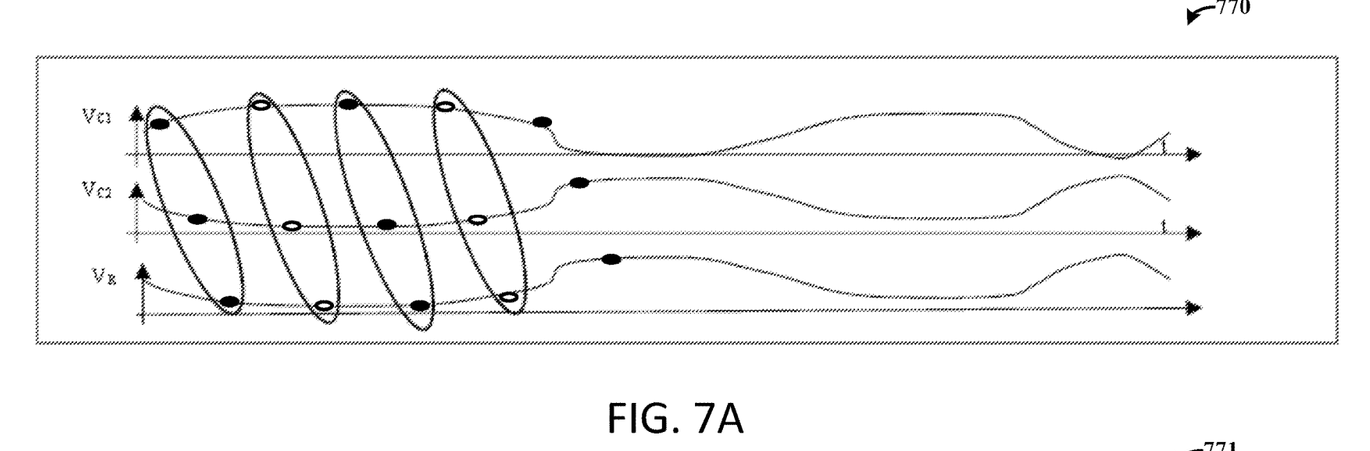
FIGS. 7A-7B are graphs illustrating analog signals in example tests facilitated by an apparatus, in accordance with the present disclosure.
Figure 7B:
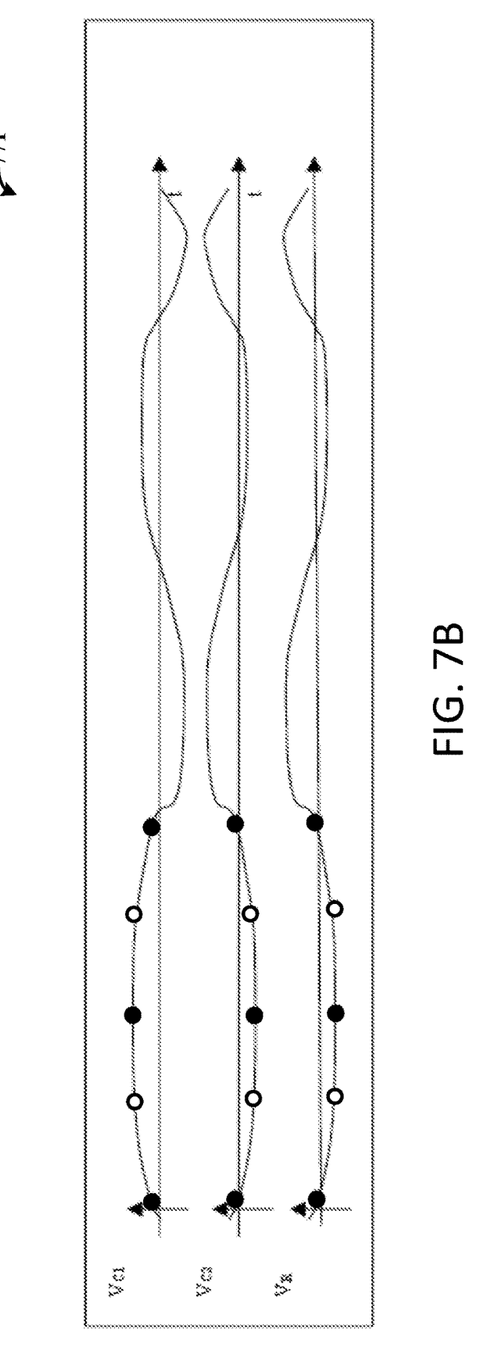

In accordance with various embodiments, the sampling skew can be modelled via delays 664, 665. That is, the different sampling times of the different $V_R$ and $V_C$ signals in the analog circuit 660 results in the same fault detection capability, albeit no fault correction may be used, in such embodiments, because the modelled circuit is not the real one. FIG. 2 shows the actual analog-mixed signal (AMS) block, FIG. 7A shows the actual times of sampling. FIG. 6 shows the modelling of the ANIS block (e.g., analog circuit 660). Although FIG. 6 illustrates delays 664, 665 as blocks, no actual delay circuits are included in the AMS block but rather that data-check circuit 662 models such delays. FIG. 7B shows the remodeled times of sampling that uses modelled delays. Remodeled means here that the checksum calculation is done as if physical delay circuits are there, and the sampling is without any skew. The result is the same as without delay boxes, but skew in the sampling.

FIGS. 7A-7B are graphs illustrating example tests facilitated by an apparatus, in accordance with the present disclosure. More specifically, FIG. 7A illustrates an example graph 770 of an analog checksum test without modeled delays, such as that carried out by an apparatus in accordance illustrated by FIG. 2 and FIG. 7B illustrates an example graph 771 of an analog checksum test using modelled delays, as may be carried out by the apparatus illustrated by FIG. 6.

Figure 8:
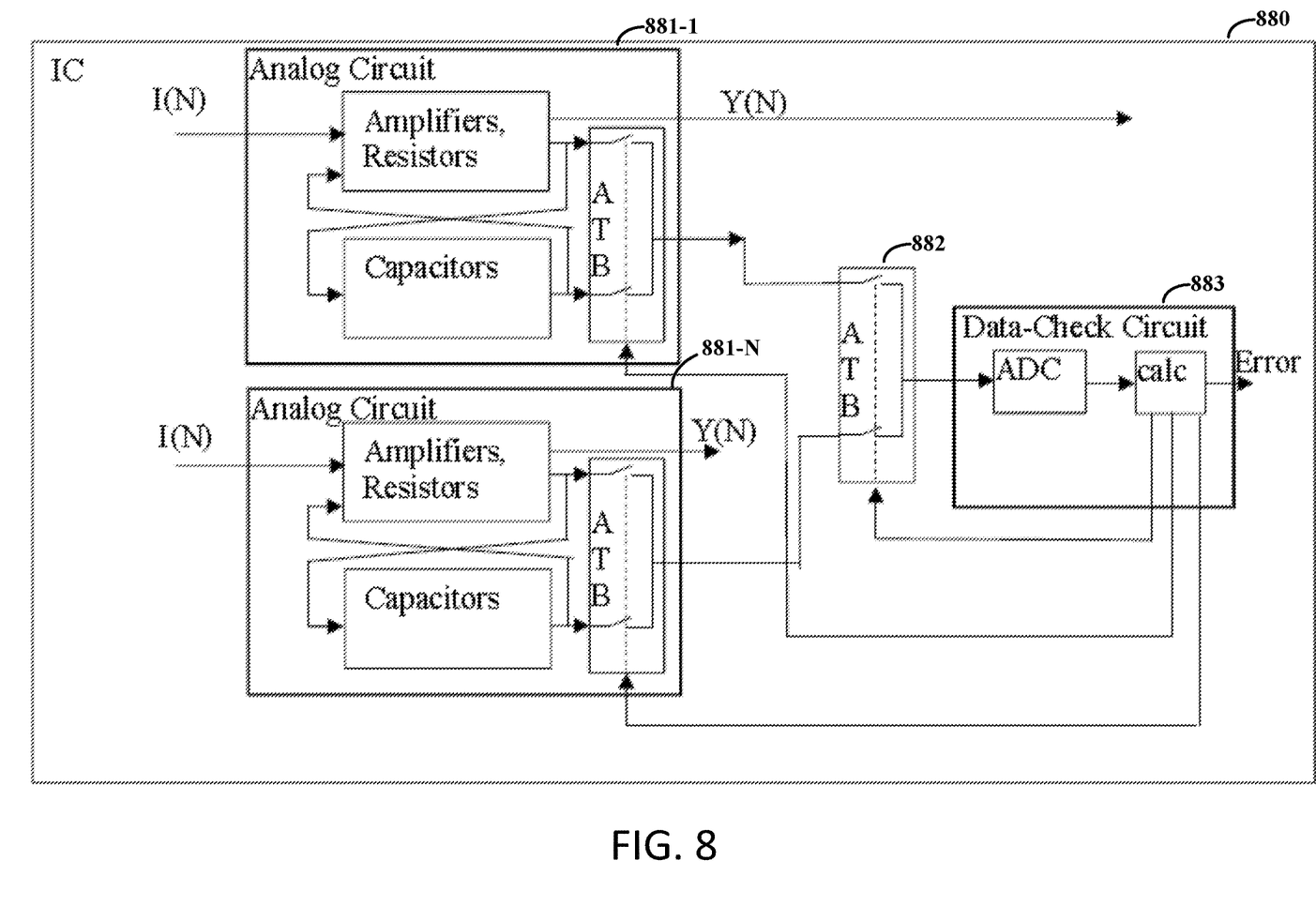
FIG. 8 illustrates an example apparatus for detecting an error conveyed by more than one linear analog circuit, in accordance with the present disclosure.

FIG. 8 illustrates an example apparatus for detecting an error conveyed by more than one linear analog circuit, in accordance with the present disclosure. As shown, various ICs can include a plurality of linear analog circuits 881-1 . . . 881-N (which are herein referred to as "the (or each) analog circuit 881-1, 881-N" for ease of reference). Each analog circuit has an ATB, which can be referred to as "local ATBs". The outputs of the local ATBs are provided to a central ATB 882. Similar to the local ATBs, the central ATB 882 is intended for production test, hence it can select one of the signals and provide the selected signal to IC pins, or a dedicated ADC used for production test. This structure can be re-used for calculating analog checksums as well, without additional hardware-overhead.

Similarly to FIGS. 1-3 and 6, each analog circuit 881-1, 881-N of the apparatus 880 has voltage-changing circuitry (e.g., amplifiers, resistors) and voltage-impedance circuitry (e.g., capacitors) coupled to a local ATB. The local ATBs are coupled to the central ATB 882. The central ATB 882 receive signals provided from each of the analog circuits 881-1, 881-N via the local ATBs of the analog circuits 881-1, 881-N and sends signals toward the ADC of the data-check circuit 883. The data-check circuit 883 captures the output analog signals sequentially from each local ATB via the central ATB 882 (selection is done by the calculation circuit), digitizes the analog values (e.g., via the ADC) and provides the results to a calculation circuit that calculates both checksums and compares them. The calculate circuit provides the control signals to the local ATBs and the central ATB 882 to control the selective passing of the different ones of the plurality of input ports. As may be appreciated, the data-check circuit 883 performs testing of the each of the analog circuits 881-1, 881-N by running, for each respectively, a sequential analog checksum test.

The circuitry illustrated by FIGS. 1-3, 6, and 8 can be used in various combinations. For example, an IC having a plurality of linear analog circuits can include a data-check circuit illustrated by FIGS. 2, 3 and/or 6. Further, the various apparatuses illustrated herein can be used to implement a variety of methods.

An example method includes receiving, at a linear analog circuit, analog input signals and providing processed analog output signals, the linear analog circuit including voltage-changing circuitry and voltage-impedance circuitry that collectively perform processing of the analog input signals by the linear analog circuit, and an ATB including a plurality of input ports. The method further includes modulating the analog input signals as provided at a plurality of voltage nodes of the voltage-changing circuitry and providing modulated analog signals at an output of the voltage-changing circuitry and impeding the modulated analog signals, via the voltage-impedance circuitry, including capacitive circuitry, and provide impeded analog signals at an output of the voltage-impedance circuitry. The method can include driving an input of voltage-impedance circuitry and one of the plurality of input ports of the ATB via the output of the voltage-changing circuitry, and another of the plurality of input ports of the ATB via the output of the voltage-impedance circuitry and selectively passing different ones of the plurality of input ports to at least one output port of the ATB responsive to control signal. In various embodiments, the method includes detecting an error conveyed by the linear analog circuit, via a data-check circuit including an ADC communicatively coupled to the at least one output port of the ATB and including a data-processing circuit, by applying the control signal, while the linear analog circuit and the data-check circuit carry out testing of the linear analog circuit, to cause the ATB to selectively pass the different ones of the plurality of input ports. The processed analog output signals can be provided during an application mode of the apparatus and simultaneously with the linear analog circuit and the data-check circuit carrying out testing of the linear analog circuit.

As described above, detecting the error conveyed by the linear analog circuit can include comparing datum indicative of the modulated analog signals and the impeded analog signals to one or more expected values. In various embodiments, facilitating the testing, by the data-check circuit, includes facilitating at least two of the following tests: a BIST, an analog checksum test, and a BIFI to provide a test that corresponds to, and provides a diagnostic coverage, according to, a certain safety integrity level. Further, the method can further include sending a correction signal to the linear analog circuit in response to the detected error conveyed by the linear analog circuit via a DAC communicatively located between the data-processing circuit and the ATB.

As described above, embodiments in accordance with the present disclosure are directed to the use of analog checksums in a functional safety context, re-using existing test structures like an ATB, ADC, and/or DAC, using multiple synergies with BIST and BIFI, and/or using a dedicated means to compensate for sampling skew. Further, although the apparatuses illustrated by FIGS. 2-3, 6, and 8 illustrate the data-check circuit having an ADC, embodiments are not so limited. For example, the data-check circuit can carry out the analog checksum test in a purely analog form, without use of an ADC (such as for high-frequency signals).

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 102 and 212 of FIGS. 1-2 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 3, 6, and 8. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described herein is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first linear analog circuit" a "second linear analog circuit" etc., where the circuit might be replaced with terms such as "circuit", "circuitry" and others, the adjectives "first" and "second" are not used to connote any description of the structure or to provide any substantive meaning; rather, such adjectives are merely used for English-language antecedence to differentiate one such similarly-named structure from another similarly-named structure.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, multiple linear analog circuits, such as those illustrated by FIG. 8 can be used in combination with the data-check circuits as those illustrated by FIGS. 1-3. As another example, the modeled delay technique (such as illustrated by FIG. 6) can be used in combination with circuitry illustrated by FIGS. 1-2. Such modifications do not depart from the true spirit and scope of various aspects of the disclosure, including aspects set forth in the claims.

What is claimed is:

1. An apparatus comprising:
   a linear analog circuit configured and arranged to receive analog input signals and provide processed analog output signals, the linear analog circuit including:
      voltage-changing circuitry and voltage-impedance circuitry collectively configured and arranged to perform processing of the analog input signals by the linear analog circuit;
      an analog test bus circuit including a plurality of input ports and configured and arranged to selectively pass different ones of the plurality of input ports to at least one output port;
      the voltage-changing circuitry configured and arranged to modulate the analog input signals as provided at a plurality of voltage nodes and provide modulated analog signals at an output of the voltage-changing circuitry; and
      the voltage-impedance circuitry, including capacitive circuitry, configured and arranged to impede the modulated analog signals and provide impeded analog signals at an output of the voltage-impedance circuitry; and
   wherein the output of the voltage-changing circuitry is configured and arranged to drive an input of voltage-impedance circuitry and one of the plurality of input ports of the analog test bus circuit, and the output of the voltage-impedance circuitry is configured and arranged to drive another of the plurality of input ports of the analog test bus circuit; and
   a data-check circuit communicatively coupled to the at least one output port of the analog test bus circuit and including a data-processing circuit configured and arranged to detect an error conveyed by the linear analog circuit by applying a control signal, while the linear analog circuit and the data-check circuit facilitate testing of the linear analog circuit, to cause the analog test bus circuit to selectively pass the different ones of the plurality of input ports.

2. The apparatus of claim 1, wherein the data-check circuit is configured and arranged to facilitate at least two of the following tests: an analog checksum test, a built-in self-test and a built-in fault injection test to provide testing of the linear analog circuit during an application mode.

3. The apparatus of claim 1, wherein the data-check circuit further includes an analog-to-digital converter (ADC) and the data-check circuit is configured and arranged to facilitate each of the following tests: an analog checksum test, a built-in self-test and a built-in fault injection test.

4. The apparatus of claim 1, wherein the linear analog circuit receives the analog input signals and provides the processed analog output signals while the linear analog circuit and the data-check circuit carry out testing of the linear analog circuit.

5. The apparatus of claim 1, wherein the analog test bus circuit is configured and arranged to access the linear analog circuit by passing analog values to and from the linear analog circuit, and wherein the data-check circuit further includes a digital-to-analog converter (DAC) communicatively located between the data-processing circuit and the analog test bus circuit, the DAC being configured and arranged to send a correction signal to the linear analog circuit in response to the detected error conveyed by the linear analog circuit.

6. The apparatus of claim 1, wherein the data-check circuit further includes an analog-to-digital converter (ADC) and the linear analog circuit and the data-check circuit are collectively configured and arranged to carry out the testing of the linear analog circuit for low-frequency signals received by the analog test bus circuit, relative to a sampling-frequency capacity of the ADC, by using the data-processing circuit to process sequentially-received signals via a quasi-parallel processing algorithm and to estimate and offset time delays associated with different internal nodes of the linear analog circuit, and therein emulating testing of probing of the different internal nodes concurrently or simultaneously.

7. The apparatus of claim 1, wherein the data-check circuit further including an analog-to-digital converter (ADC) and the linear analog circuit and the data-check circuit are collectively configured and arranged to carry out the testing of the linear analog circuit for signals received by the analog test bus circuit and which have a period length of an order corresponding to a sampling-frequency capacity of the ADC, by causing the ADC and the data-processing circuit to undersample and therein estimate a voltage difference between the signals at the plurality of voltage nodes.

8. The apparatus of claim 1, wherein a model of the linear analog circuit used in an analog processing algorithm of the data-check circuit includes selective time delays, for offsetting signal skew, in signals driving the analog test bus circuit.

9. The apparatus of claim 1, wherein the apparatus further includes built-in self-test circuitry configured and arranged to carry out a built-in self-test and built-in fault injection circuitry configured and arranged to carry out a built-in fault injection test, wherein the data-check circuit is configured and arranged to carry out an analog checksum test and facilitate the built-in self-test and the built-in fault injection test.

10. The apparatus of claim 1, wherein the data-check circuit further including an analog-to-digital converter (ADC) and the linear analog circuit and the data-check circuit are collectively configured and arranged to carry out the testing of the linear analog circuit by using the ADC and the data-processing circuit to process signals via an algorithm configured to model time delays in respective signals directed towards the analog test bus circuit, for offsetting signal skew.

11. The apparatus of claim 1, wherein the linear analog circuit and the data-check circuit are collectively configured and arranged to facilitate the testing of the linear analog circuit by testing for parametric and transient faults via each of the following tests: built-in self-test, built-in fault injection test, and an analog checksum test.

12. The apparatus of claim 1, wherein the linear analog circuit and the data-check circuit are collectively configured and arranged to facilitate the testing of the linear analog circuit by using an analog-to-digital converter (ADC) and the data-processing circuit to process signals via an algorithm configured to facilitate only one of a built-in self-test and an analog checksum test.

13. The apparatus of claim 1, wherein the linear analog circuit and the data-check circuit are collectively configured and arranged to facilitate the testing of the linear analog circuit by using an analog-to-digital converter (ADC) and the data-processing circuit to process signals via an algorithm configured to facilitate at least one of a built-in self-test and a built-in fault injection test in response to an analog checksum test detecting the error.

14. The apparatus of claim 1, wherein the apparatus further includes:
  at least one additional linear analog circuit configured and arranged to provide processed analog output signals, the at least one additional linear analog circuit including:
    another voltage-changing circuitry and another voltage-impedance circuitry collectively configured and arranged to perform processing of the analog input signals by the additional linear analog circuit, and
    another analog test bus circuit including a plurality of input ports and configured and arranged to selectively pass different ones of the plurality of input ports to at least one output port; and
  a central analog test bus circuit configured and arranged to receive signals provided from each of the linear analog circuits, including the first-recited linear analog circuit and the at least one additional linear analog circuit, and configured to send signals toward the data-check circuit.

15. The apparatus of claim 14, wherein the data-check circuit is configured and arranged to perform testing of each of the linear analog circuit and the at least one additional linear analog circuit by running, for each respectively, an analog checksum test.

16. A method, comprising:
  receiving, at an linear analog circuit, analog input signals and providing processed analog output signals, the linear analog circuit including voltage-changing circuitry and voltage-impedance circuitry collectively configured and arranged to perform processing of the analog input signals by the linear analog circuit, and an analog test bus circuit including a plurality of input ports;
  modulating the analog input signals as provided at a plurality of voltage nodes of the voltage-changing circuitry and providing modulated analog signals at an output of the voltage-changing circuitry;
  impeding the modulated analog signals, via the voltage-impedance circuitry, including capacitive circuitry, and provide impeded analog signals at an output of the voltage- impedance circuitry;
  driving an input of voltage-impedance circuitry and one of the plurality of input ports of the analog test bus circuit via the output of the voltage-changing circuitry, and another of the plurality of input ports of the analog test bus circuit via the output of the voltage-impedance circuitry;

selectively passing different ones of the plurality of input ports to at least one output port of the analog test bus circuit responsive to a control signal; and detecting an error conveyed by the linear analog circuit, via a data-check circuit including an analog-to-digital converter (ADC) communicatively coupled to the at least one output port of the analog test bus circuit and including a data-processing circuit, by applying the control signal, while the linear analog circuit and the data-check circuit carry out testing of the linear analog circuit, to cause the analog test bus circuit to selectively pass the different ones of the plurality of input ports.

17. The method of claim 16, further including providing the processed analog output signals during an application mode of the linear analog circuit and simultaneously with the linear analog circuit and the data-check circuit carrying out testing of the linear analog circuit.

18. The method of claim 16, wherein detecting the error conveyed by the linear analog circuit includes comparing datum indicative of the modulated analog signals and the impeded analog signals to one or more expected values.

19. The method of claim 16, wherein facilitate the testing, by the data-check circuit, includes facilitating at least two of the following tests: a built-in self-test, an analog checksum test, and a built-in fault injection test to provide a test that corresponds to, and provides a diagnostic coverage according to, a certain safety integrity level.

20. The method of claim 16, further including sending a correction signal to the linear analog circuit in response to the detected error conveyed by the linear analog circuit via a digital-to-analog converter communicatively located between the data-processing circuit and the analog test bus circuit.

* * * * *